United States Patent
Piao et al.

(10) Patent No.: US 11,657,766 B2
(45) Date of Patent: May 23, 2023

(54) SENSING CIRCUIT AND SOURCE DRIVER INCLUDING THE SAME

(71) Applicant: LX Semicon Co., Ltd., Daejeon (KR)

(72) Inventors: Taiming Piao, Daejeon (KR); Young Bok Kim, Daejeon (KR); Won Kim, Daejeon (KR); Byeon Cheol Lee, Daejeon (KR)

(73) Assignee: LX SEMICON CO., LTD., Daejeon (KR)

( * ) Notice: Subject to any disclaimer, the term of this patent is extended or adjusted under 35 U.S.C. 154(b) by 0 days.

(21) Appl. No.: 17/456,114

(22) Filed: Nov. 22, 2021

(65) Prior Publication Data

US 2022/0165219 A1 May 26, 2022

(30) Foreign Application Priority Data

Nov. 25, 2020 (KR) .................. 10-2020-0160264

(51) Int. Cl.
*G09G 3/3275* (2016.01)
*G09G 3/3233* (2016.01)
*H03F 3/45* (2006.01)

(52) U.S. Cl.
CPC ......... *G09G 3/3275* (2013.01); *G09G 3/3233* (2013.01); *H03F 3/45269* (2013.01); *H03F 3/45273* (2013.01); *G09G 2300/0842* (2013.01); *G09G 2310/0291* (2013.01); *G09G 2320/0295* (2013.01)

(58) Field of Classification Search
CPC .............. G01R 31/2635; G02F 1/1309; H01L 51/0031; G06V 40/1318; G09G 3/3241; G09G 3/3275; G09G 2300/0842; G09G 2310/0291; G09G 2320/0223; G09G 2320/0295; H03F 3/45179; H03F 3/45269; H03F 3/303; H03F 3/45273; H03F 2200/453; H03F 2200/474; H03F 2200/456
See application file for complete search history.

(56) References Cited

U.S. PATENT DOCUMENTS

| | | | |
|---|---|---|---|
| 2015/0162883 A1* | 6/2015 | Nielsen | H03F 1/56 330/257 |
| 2018/0114815 A1* | 4/2018 | Lee | G06V 40/1318 |
| 2018/0172744 A1* | 6/2018 | Chang | H03K 17/962 |
| 2021/0193039 A1* | 6/2021 | Piao | G09G 3/3291 |
| 2021/0217361 A1* | 7/2021 | Feng | G09G 3/3233 |

FOREIGN PATENT DOCUMENTS

| | | |
|---|---|---|
| KR | 20110066506 A | 6/2011 |
| KR | 20160087058 A | 7/2016 |
| KR | 2020-0036592 A | 4/2020 |
| KR | 2020-0036999 A | 4/2020 |

\* cited by examiner

*Primary Examiner* — Nitin Patel
*Assistant Examiner* — Amen W Bogale
(74) *Attorney, Agent, or Firm* — Polsinelli PC

(57) ABSTRACT

The present disclosure discloses a sensing circuit and a source driver including the same, capable of decreasing influence on the performance of an integrator according to a panel load and reducing a chip area by excluding a feedback capacitor of the integrator. The sensing circuit may convert an input current, received from a display panel, into an output current having linearity and an amount of current smaller than the input current.

16 Claims, 3 Drawing Sheets

SENSING CIRCUIT AND SOURCE DRIVER INCLUDING THE SAME

BACKGROUND

1. Technical Field

Various embodiments generally relate to a display device, and more particularly, to a sensing circuit which senses pixel signals of a display panel, and a source driver including the same.

2. Related Art

In general, a display device includes a display panel, a display driving device, and a timing controller.

The display driving device may include a source driver which is integrated as a chip. The display driving device may include a plurality of source drivers in consideration of the size and resolution of the display panel. Such a source driver converts digital image data, provided from the timing controller, into a source signal, and provides the source signal to the display panel.

The source driver senses pixel signals of the display panel, and converts the pixel signals into digital data.

The source driver according to the conventional art may include sensing circuits which sense the pixel signals, and each sensing circuit may include an integrator which converts an input current into a voltage.

However, the integrator of the source driver according to the conventional art has a difference in the performance thereof according to a panel load, and requires a feedback capacitor for each of multiple channels.

Accordingly, there is a need for a technology capable of decreasing influence on the performance of an integrator according to a panel load and reducing the chip area of a sensing circuit and a source driver by excluding a feedback capacitor of the integrator.

Moreover, the sensing circuit and the source driver require a sampling capacitor for sampling a pixel signal. Therefore, in order to reduce the chip area of the sensing circuit and the source driver, there is a need for a technology capable of implementing the sampling capacitor with a smaller size.

SUMMARY

Various embodiments are directed to a sensing circuit and a source driver including the same, capable of decreasing influence on the performance of an integrator according to a panel load and reducing a chip area by excluding a feedback capacitor of the integrator.

Also, various embodiments are directed to a sensing circuit and a source driver including the same, capable of using a sampling capacitor of a small size by reducing an amount of current for sampling and as a result reduce a chip area.

In an embodiment, a sensing circuit may include: an amplifier circuit configured to receive an input current from a display panel, wherein the amplifier circuit converts the input current into an output current, and outputs the output current to have an amount of current smaller than the input current.

In an embodiment, a source driver may include: a sensing circuit configured to output a sampling voltage by sensing an input current received from a display panel; a global amplifier configured to output an amplified signal by amplifying the sampling voltage; and an analog-to-digital converter configured to convert the amplified signal into digital data, the sensing circuit including: an amplifier circuit configured to convert the input current into an output current, and output the output current to have an amount of current smaller than the input current; and a sampling circuit configured to output the sampling voltage by sampling the output current.

As described above, by including an amplifier circuit which converts an input current into an output current, influence on the performance of an integrator according to a panel load may be decreased, and a chip area may be reduced by excluding a feedback capacitor of the integrator.

Also, a reference voltage of the amplifier circuit may be set to a lower level as compared to the conventional art.

Further, since the amplifier circuit is configured to output the output current using an amount of current smaller than the input current, a sampling capacitor for sampling the output current may be designed to have a small capacitance. That is to say, a sensing circuit and a source driver may be implemented using the sampling capacitor having a small area, and as a result, an advantage is provided in that a chip area may be reduced.

In addition, signals of pixels may be accurately sensed regardless of an increase in the number of multiple channels.

DETAILED DESCRIPTION

The present disclosure discloses embodiments of a sensing circuit and a source driver including the same, capable of decreasing influence on the performance of an integrator according to a load of a display panel and reducing a chip area by excluding a feedback capacitor of the integrator.

In the embodiments, a plurality of channels may be connected to sensing lines of the display panel, and an input current received through a channel may be defined as a pixel signal which is used to detect pixel characteristics. For example, the pixel characteristics may include threshold voltages, mobilities, etc. of a driving transistor and an organic light-emitting diode.

In the embodiments, each of the plurality of channels may include a sensing circuit, and for the sake of convenience in explanation, the sensing circuit of one channel will be described.

In the embodiments, terms such as first and second may be used to identify various components. The components are not limited by the terms such as first and second.

Figure 1:
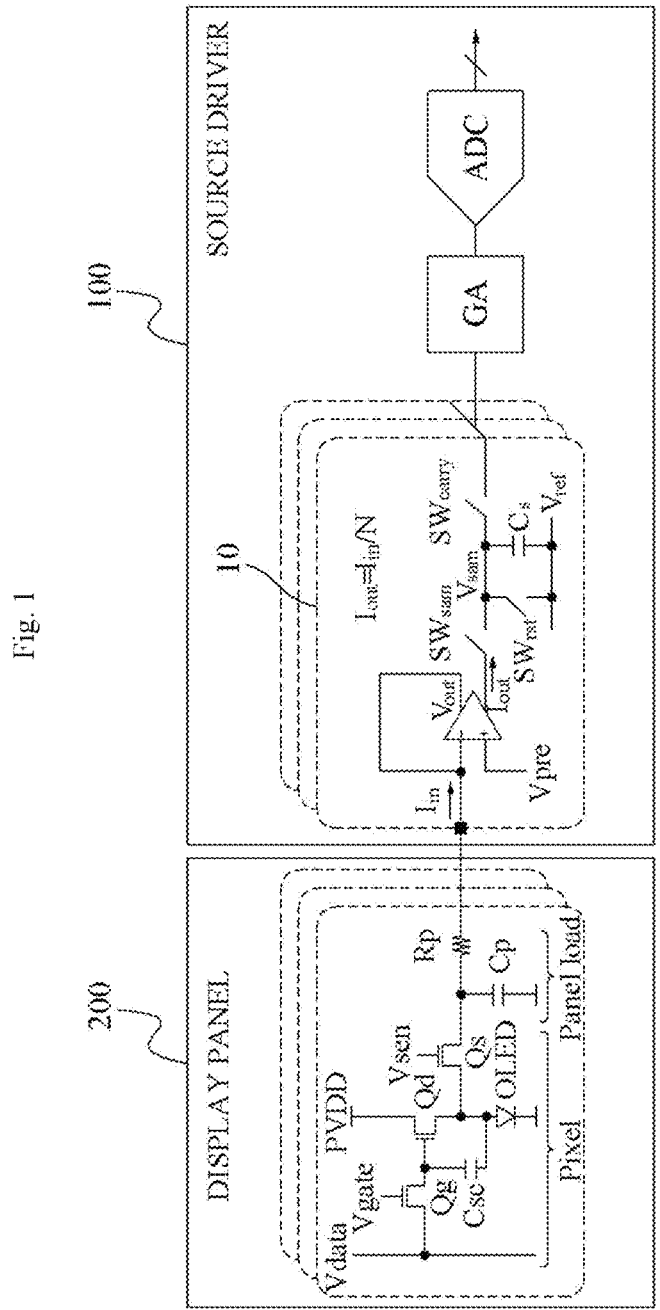
FIG. 1 is a block diagram of a sensing circuit and a source driver including the same in accordance with an embodiment.

FIG. 1 is a block diagram of a sensing circuit 10 and a source driver 100 including the same in accordance with an embodiment.

Referring to FIG. 1, a display device may include a display panel 200 and the source driver 100.

The display panel 200 may include pixels which are formed in a matrix form.

Each pixel may include an organic light-emitting diode OLED, a storage capacitor Csc, a driving transistor Qd, a gate transistor Qg, and a sensing transistor Qs.

Vdata denotes a driving voltage for controlling light emission and is provided to the drain of the gate transistor Qg, and Vgate denotes a gate signal for the operation of the gate transistor Qg. Therefore, the gate transistor Qg may switch the transfer of the driving voltage Vdata to the gate of the driving transistor Qd by the gate signal Vgate.

PVDD denotes a constant voltage and is provided to the drain of the driving transistor Qd. Therefore, the driving transistor Qd may control an amount of current supplied to the organic light-emitting diode OLED by the constant voltage PVDD according to the level of the driving voltage Vdata applied to the gate thereof through the gate transistor Qg.

Vsen denotes a sensing control signal for controlling the operation of the sensing transistor Qs. Therefore, the sensing transistor Qs may provide an input current corresponding to a voltage, charged to a node between the driving transistor Qd and the organic light-emitting diode OLED, to the sensing circuit 10 through a panel load, according to the sensing control signal Vsen.

Each of the pixels of the display panel 200 is connected to the sensing circuit 10 of the source driver 100 through a panel load. It may be understood that the panel load applied to each of the pixels represents a capacitor component Cp and a resistor component Rp which are equivalently formed on a sensing line configured between the sensing transistor Qs and the sensing circuit 10.

The source driver 100 may include the sensing circuit 10, a global amplifier GA, and an analog-to-digital converter ADC.

The sensing circuit 10 may be configured to correspond to each of a plurality of channels. The channel means that each panel load, that is, the sensing line, of the display panel 200 is connected to the sensing circuit 10. The source driver 100 may include the plurality of channels, and the sensing circuit 10 may be configured for each of the plurality of channels.

The sensing circuit 10 may receive an input current Iin from the pixel of a corresponding channel of the display panel 200. The sensing circuit 10 is configured to convert the input current Iin into an output current Tout having linearity. The output current Tout is generated to have a smaller amount of current than the input current Iin.

The sensing circuit 10 may sample the output current Tout for the channel, and may output a sampling voltage Vsam to the global amplifier GA. Sensing circuits 10 corresponding to the plurality of channels may be configured to sequentially output sampling voltages Vsam, and to this end, a multiplexer (not illustrated) may be configured between the sensing circuits 10 and the global amplifier GA.

The global amplifier GA may amplify the sampling voltages Vsam sequentially outputted from the sensing circuits 10, and may output amplified signals to the analog-to-digital converter ADC.

The analog-to-digital converter ADC may convert the amplified signal into digital data and provide the digital data to a timing controller (not illustrated). The timing controller may generate compensation data corresponding to pixel characteristics using the digital data, and may correct image data using the compensation data.

Figure 2:
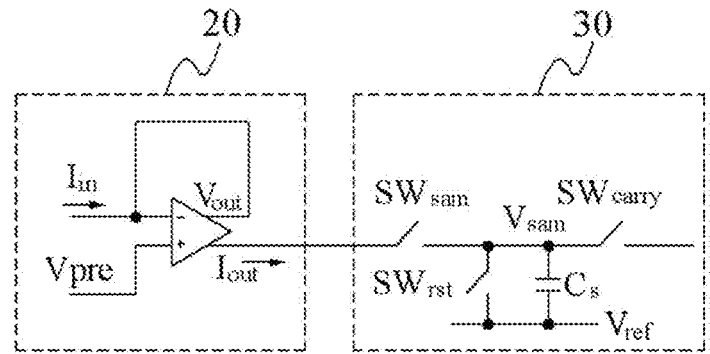
FIG. 2 is a circuit diagram of the sensing circuit in accordance with the embodiment.
Figure 3:
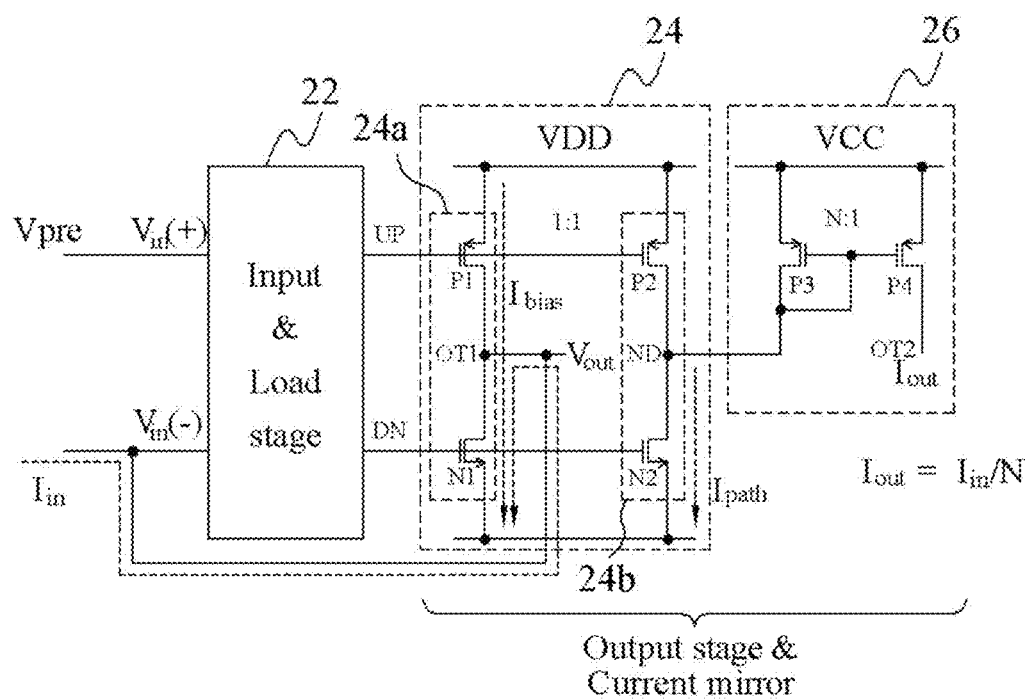
FIG. 3 is a circuit diagram of an amplifier circuit illustrated in FIGS. 1 and 2.

FIG. 2 is a circuit diagram of the sensing circuit 10 in accordance with the embodiment. FIG. 3 is a circuit diagram of an amplifier circuit illustrated in FIGS. 1 and 2.

Referring to FIG. 2, the sensing circuit 10 may include an amplifier circuit 20 and a sampling circuit 30. The amplifier circuit 20 is configured to convert the input current Iin into the output current Tout having linearity, and output the output current Tout to have an amount of current smaller than the input current Iin. The sampling circuit 30 is configured to sample the output current Tout to output the sampling voltage Vsam.

First, the amplifier circuit 20 will be described in detail with reference to FIG. 3.

The amplifier circuit 20 may include an input and load stage circuit 22, an output stage circuit 24 and a current mirror circuit 26.

The input and load stage circuit 22 may include a first input terminal Vin(−) which receives the input current Iin and a second input terminal Vin(+) which receives a first reference voltage Vpre.

The input and load stage circuit 22 may output a pull-up signal UP and a pull-down signal DN in response to the input current Iin and the first reference voltage Vpre. In detail, the input and load stage circuit 22 is configured to generate the pull-up signal UP and the pull-down signal DN corresponding to the potential difference between the first input terminal Vin(−) and the second input terminal Vin(+).

The output stage circuit 24 is configured to output a first output voltage Vout corresponding to the input current Iin and a source current corresponding to a first scale of the input current Iin, in response to the pull-up signal UP and the pull-down signal DN. To this end, the output stage circuit 24 may include a first output stage circuit 24a and a second output stage circuit 24b.

The first output stage circuit 24a may output the first output voltage Vout corresponding to the input current Iin in response to the pull-up signal UP and the pull-down signal DN. For example, the first output stage circuit 24a may include a PMOS transistor P1 and an NMOS transistor N1 which are connected in series between a terminal of a first power supply voltage VDD and a terminal of a ground voltage. A node between the PMOS transistor P1 and the NMOS transistor N1 may be defined as a first output terminal OT1 which outputs the first output voltage Vout, and the first output terminal OT1 of the first output stage circuit 24a and the first input terminal Vin(−) of the input and load stage circuit 22 may be interconnected.

The second output stage circuit 24b may form a source current which corresponds to the input current Iin and flows through a current path Ipath, in response to the pull-up signal UP and the pull-down signal DN. For example, the second output stage circuit 24b may include a PMOS transistor P2 and an NMOS transistor N2 which are connected in series between a terminal of the first power supply voltage VDD and a terminal of the ground voltage. A node between the PMOS transistor P2 and the NMOS transistor N2 may be defined as a node ND which outputs the source current.

The second output stage circuit 24b may be configured to have a copy ratio of 1:1 to the first output stage circuit 24a. The copy ratio may be understood as a ratio between amounts of currents flowing according to a channel ratio of transistors included in the first output stage circuit 24a and the second output stage circuit 24b.

In other words, it may be understood that the second output stage circuit 24b outputs the source current by copying the current of the first output stage circuit 24a corresponding to the input current Iin at the copy ratio of 1:1 in response to the pull-up signal UP and the pull-down signal DN. Therefore, it may be understood that the input current Iin, the current of the first output stage circuit 24a and the source current are defined as having an amount of current within the first scale and have the same amount of current.

The current mirror circuit 26 is configured to copy the source current, flowing through the current path Ipath, from the node ND of the second output stage circuit 24b and thereby output the output current Tout of a second scale with a smaller amount of current than the first scale. The output current Tout may be outputted to have linearity with respect to the input current Iin by the copying of the output stage circuit 24 and the current mirror circuit 26. For example, the current mirror circuit 26 may copy the output current Tout at a copy ratio of 1/N (N is a positive real number greater than 1) preset with respect to the source current of the second output stage circuit 24b.

The current mirror circuit 26 may include a PMOS transistor P3 and a PMOS transistor P4. The PMOS transistor P3 is configured between a terminal of a second power supply voltage VCC and the node ND, and the PMOS transistor P4 is configured between a terminal of the second power supply voltage VCC and a second output terminal OT2. The gate terminals of the PMOS transistor P3 and the PMOS transistor P4 may be interconnected, and may be connected to the node ND.

In the current mirror circuit 26, the PMOS transistor P3 and the PMOS transistor P4 may have a channel ratio of N:1. As a result, the current mirror circuit 26 may have a copy ratio of N:1 to a current. The second power supply voltage VCC of the current mirror circuit 26 may be set to a level lower than the first power supply voltage VDD of the output stage circuit 24.

By the above-described configuration, when the source current flows through the second output stage circuit 24b, the current mirror circuit 26 may output the output current Tout having an amount of current corresponding to 1/N of the source current through the PMOS transistor P4 and the second output terminal OT2 by the current flow of the PMOS transistor P3 of the current mirror circuit 26.

Returning to the description of FIG. 2, the sampling circuit 30 may sample the output current Tout outputted from the amplifier circuit 20, and may output the sampling voltage Vsam.

The sampling circuit 30 may include a first switch SWsam, a sampling capacitor Cs, a second switch SWcarry, and a third switch SWrst.

The first switch SWsam may transfer the output current Tout, outputted from the amplifier circuit 20, to the sampling capacitor Cs. For example, first switches SWsam of the plurality of channels may be simultaneously turned on.

The sampling capacitor Cs may sample the output current Tout transferred through the first switch SWsam.

The second switch SWcarry may output the sampling voltage Vsam, sampled through the sampling capacitor Cs, to the global amplifier GA. For example, second switches SWcarry of the plurality of channels may be sequentially turned on at predetermined time intervals.

The third switch SWrst may initialize the sampling capacitor Cs to a second reference voltage Vref.

The second reference voltage Vref of the sampling circuit 30 may be set to a level lower than the first reference voltage Vpre inputted to the amplifier circuit 20 to be compared with the input current Iin.

Figure 4:
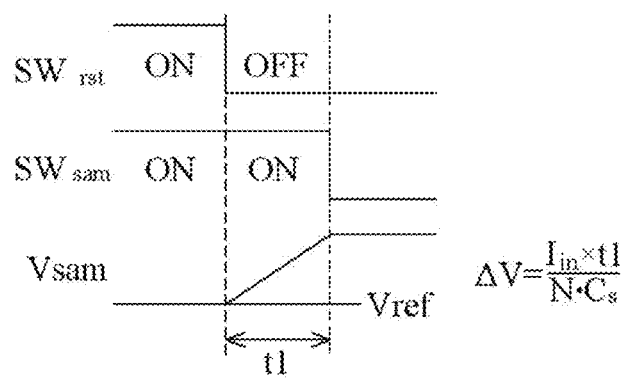
FIG. 4 is a timing diagram of the sensing circuit in accordance with the embodiment.

FIG. 4 is a timing diagram of the sensing circuit 10 in accordance with the embodiment. In FIG. 4, a waveform SWrst means a signal for controlling the switching of the third switch SWrst, a waveform SWsam means a signal for controlling the switching of the first switch SWsam, and ON and OFF mean the turn-on and turn-off of corresponding switches.

Referring to FIGS. 2 and 4, first, the sensing circuit 10 may initialize the sampling voltage Vsam of the sampling capacitor Cs to a second reference voltage Vref by turning on the first switch SWsam and the third switch SWrst.

Then, the sensing circuit 10 may sample the output current Tout, outputted from the amplifier circuit 20, through the sampling capacitor Cs by turning on the first switch SWsam and turning off the third switch SWrst.

The sensing circuit 10 may sample the output current Tout, transferred through the first switch SWsam, for a preset time t1. The sampling capacitor Cs may be charged with charge through the output current Tout, and through this, the sampling voltage Vsam may rise for the preset time t1.

In succession, the sensing circuit 10 may maintain the sampling voltage Vsam by turning off the first switch SWsam.

The intensity ΔV of the sampling voltage Vsam may be calculated as in Equation 1 below.

$$\Delta V = \frac{I_{in} \times t1}{N \cdot C_S} \quad \text{[Equation 1]}$$

The intensity ΔV of the sampling voltage Vsam may be determined by the copy ratio of 1/N with respect to the input current Iin having linearity, the sampling time t1 and the capacitance of the sampling capacitor Cs.

Subsequently, the sensing circuit 10 may sequentially output the sampling voltage Vsam to the global amplifier GA by turning on the second switch SWcarry.

As is apparent from the above description, by including an amplifier circuit which converts an input current into an output current, the sensing circuit and the source driver including the same in accordance with the embodiments may decrease influence on the performance of an integrator according to a panel load, and may reduce a chip area by excluding a feedback capacitor of the integrator.

Also, in the sensing circuit in accordance with the embodiments, a reference voltage of the amplifier circuit may be set to a lower level as compared to the conventional art.

Also, the sensing circuit and the source driver in accordance with the embodiments may accurately sense the signals of pixels regardless of an increase in the number of multiple channels.

In addition, in the sensing circuit and the source driver in accordance with the embodiments, the amplifier circuit is configured to output the output current using an amount of current smaller than the input current. Therefore, a sampling capacitor for sampling the output current may be designed to have a small capacitance. As a result, the sensing circuit and the source driver may be implemented using the sampling capacitor having a small area, and an advantage is provided in that a chip area may be reduced.

What is claimed is:

1. A sensing circuit comprising:
   an amplifier circuit configured to receive an input current from a display panel; and
   wherein the amplifier circuit converts the input current into an output current, and outputs the output current to have an amount of current smaller than the input current,
   a sampling circuit configured to output a sampling voltage by sampling the output current,
   and wherein the sampling circuit comprises:

a first switch configured to transfer the output current;
a sampling capacitor configured to sample the output current transferred through the first switch;
a second switch configured to output the sampling voltage sampled through the sampling capacitor; and
a third switch configured to initialize the sampling capacitor to a second reference voltage.

2. The sensing circuit according to claim 1, wherein the amplifier circuit comprises:
an input and load stage circuit configured to output a pull-up signal and a pull-down signal in response to the input current and a first reference voltage;
an output stage circuit configured to output a first output voltage corresponding to the input current and a source current corresponding to a first scale of the input current, in
response to the pull-up signal and the pull-down signal; and
a current mirror circuit configured to output the output current of a second scale with a smaller amount of current than the first scale, by copying the source current.

3. The sensing circuit according to claim 2, wherein the output stage circuit comprises:
a first output stage circuit configured to output the first output voltage corresponding to the input current, in response to the pull-up signal and the pull-down signal; and
a second output stage circuit configured to output the source current corresponding to the first scale, by copying a current of the first output stage circuit corresponding to the input current in response to the pull-up signal and the pull-down signal.

4. The sensing circuit according to claim 3, wherein an output terminal of the first output stage circuit through which the first output voltage is outputted and an input terminal of the input and load stage circuit through which the input current is inputted are interconnected.

5. The sensing circuit according to claim 2, wherein
the output stage circuit outputs the first output voltage and the source current of the first scale by using a first power supply voltage, and
the current mirror circuit copies and outputs the output current of the second scale by using a second power supply voltage of a level lower than the first power supply voltage.

6. The sensing circuit according to claim 2, wherein the current mirror circuit copies the output current at a copy ratio of 1/N (N is a positive real number greater than 1) preset with respect to the source current.

7. The sensing circuit according to claim 1, wherein the second reference voltage of the sampling circuit is set to a level lower than a first reference voltage inputted to the amplifier circuit to be compared with the input current.

8. The sensing circuit according to claim 1, wherein the amplifier circuit converts the input current into an output current having linearity.

9. A source driver comprising:
a sensing circuit configured to output a sampling voltage by sensing an input current received from a display panel;
a global amplifier configured to output an amplified signal by amplifying the sampling voltage; and
an analog-to-digital converter configured to convert the amplified signal into digital data,
the sensing circuit comprising:
an amplifier circuit configured to convert the input current into an output current, and output the output current to have an amount of current smaller than the input current; and
a sampling circuit configured to output the sampling voltage by sampling the output current,
wherein the sampling circuit comprises:
a first switch configured to transfer the output current
a sampling capacitor configured to sample the output current transferred through the first switch;
a second switch configured to output the sampling voltage sampled through the sampling capacitor; and
a third switch configured to initialize the sampling capacitor to a second reference voltage.

10. The source driver according to claim 9, wherein the amplifier circuit comprises:
an input and load stage circuit configured to output a pull-up signal and a pull-down signal in response to the input current and a first reference voltage;
an output stage circuit configured to output a first output voltage corresponding to the input current and a source current corresponding to a first scale of the input current, in response to the pull-up signal and the pull-down signal; and
a current mirror circuit configured to output the output current of a second scale with a smaller amount of current than the first scale, by copying the source current.

11. The source driver according to claim 10, wherein the output stage circuit comprises:
a first output stage circuit configured to output the first output voltage corresponding to the input current, in response to the pull-up signal and the pull-down signal; and
a second output stage circuit configured to output the source current corresponding to the first scale, by copying a current of the first output stage circuit corresponding to the input current in response to the pull-up signal and the pull-down signal.

12. The source driver according to claim 11, wherein an output terminal of the first output stage circuit through which the first output voltage is outputted and an input terminal of the input and load stage circuit through which the input current is inputted are interconnected.

13. The source driver according to claim 10, wherein
the output stage circuit outputs the first output voltage and the source current of the first scale by using a first power supply voltage, and
the current mirror circuit copies and outputs the output current of the second scale by using a second power supply voltage of a level lower than the first power supply voltage.

14. The source driver according to claim 10, wherein the current mirror circuit copies the output current at a copy ratio of 1/N (N is a positive real number greater than 1) preset with respect to the source current.

15. The source driver according to claim 9, wherein the second reference voltage of the sampling circuit is set to a level lower than a first reference voltage inputted to the amplifier circuit to be compared with the input current.

16. The sensing circuit according to claim 9, wherein the amplifier circuit converts the input current into an output current having linearity.

* * * * *